United States Patent
Wang et al.

(10) Patent No.: US 7,582,898 B2
(45) Date of Patent: Sep. 1, 2009

(54) CIRCUIT STRUCTURE WITH A DOUBLE-GATE ORGANIC THIN FILM TRANSISTOR DEVICE AND APPLICATION THEREOF

(75) Inventors: Yu-Wu Wang, Hsin Chu Hsien (TW); Yi-Kai Wang, Hsin Chu Hsien (TW); Chen-Pang Kung, Hsin Chu Hsien (TW); Chih-Wen Hsiao, Hsin Chu Hsien (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 11/459,013

(22) Filed: Jul. 20, 2006

(65) Prior Publication Data

US 2007/0257252 A1 Nov. 8, 2007

(30) Foreign Application Priority Data

May 3, 2006 (TW) ............................... 95115690 A

(51) Int. Cl.
*H01L 35/24* (2006.01)

(52) U.S. Cl. ........... 257/40; 257/E51.004; 257/E51.005

(58) Field of Classification Search .................. 257/74, 257/40, E51.004–E51.005
See application file for complete search history.

(56) References Cited

U.S. PATENT DOCUMENTS 6,335,539 B1 * 1/2002 Dimitrakopoulos et al. ... 257/40
6,661,024 B1 * 12/2003 Zhang et al. .................. 257/40

* cited by examiner

*Primary Examiner*—Kiesha L Rose
*Assistant Examiner*—Minchul Yang
(74) *Attorney, Agent, or Firm*—Morris Manning & Martin; Raymond J. Ho

(57) ABSTRACT

This invention provides a circuit structure with a double-gate organic thin film transistor device and application thereof. A protection layer covered on an organic thin film transistor structure having a bottom gate is used as another gate insulating layer. A metal layer is formed on this gate insulating layer to serve as another gate. A double-gate structure is hence accomplished. The double-gate structure can be used in a circuit. By the double-gate structure the threshold voltage of the organic thin film transistor can be adjusted, and advantageously changing the characteristic of the organic thin film transistor to improve the accuracy of signal transmission.

2 Claims, 3 Drawing Sheets

CIRCUIT STRUCTURE WITH A DOUBLE-GATE ORGANIC THIN FILM TRANSISTOR DEVICE AND APPLICATION THEREOF

BACKGROUND OF THE INVENTION

1. Field of the Invention

The present invention relates to a circuit structure with organic thin film transistors; and more particularly to a circuit structure with a double-gate organic thin film transistor device.

2. Description of the Related Art

Because there is no any doping process involved in the manufacture of the current organic thin film transistor, the threshold voltage of the transistor device can not be controlled. The threshold voltage of the transistor device always relies on surface conditions of the device, the purity of the organic semiconductor material, and the material characteristics of the gate and gate insulating layers. The threshold voltage $V_{th}$ is always too large up to ten volts or more, which makes not only power consumption but also loss of a certain voltage, and causing distortion of signal transmission in an application of electronic circuit. FIG. 1A and FIG. 1B are schematic circuit structures of two kinds of conventional inverters. The conventional inverter of FIG. 1A includes a first enhanced-type N channel transistor 10 and a second enhanced-type N channel transistor 12. The second enhanced-type N channel transistor 12 is an organic thin film transistor. Because the inverter has the second enhanced-type N channel transistor 12, there is a voltage difference of $V_{th}$ between the output 14 of the inverter and the drain 16 of the second enhanced-type transistor 12, and resulting in the shift of an output signal value of the output 14. The transmitted signal is distorted. Due to the large threshold voltage of the organic thin film transistor, the signal distortion is more severe. For reducing the threshold voltage and improving accuracy of signal transmission, the inverter design of FIG. 1B is mostly adopted. This kind of the inverter includes an enhanced-type N channel transistor 10a and a depletion-type N channel transistor 12a. The depletion-type N channel transistor 12a is an organic thin film transistor. By surface treatment of the interface between the metal gate and N channel area, the depletion-type N channel transistor 12a is realized. During the current LCD display panel manufacturing process, the thin film transistor devices of the driving circuit area and the thin film transistor devices of the pixel area are simultaneously produced. When adopting the inverter design of FIG. 1B in the driving circuit of the LCD (Liquid Crystal Display) display panel and proceeding the surface treatment of the interfaces between the metal gates and N channel areas of the organic thin film transistors of the driving circuit area to make the organic thin film transistors become depletion type, the thin film transistors of the pixel area would also become depletion type. As a consequence, the switch elements of the pixel area will make mal-operation.

Accordingly, it is desirable to provide an improved circuit structure with the organic thin film transistor to alleviate the distortion of the signal transmission of the electronic circuit due to the too high threshold voltage of the organic thin film transistor.

SUMMARY OF THE INVENTION

One objective of the present invention is to provide a circuit structure with a double-gate organic thin film transistor device, in which the characteristic of the double-gate organic thin film transistor is advantageously changed by the double-gate structure, and hence improving accuracy of signal transmission.

Another objective of the present invention is to provide a circuit structure with a double-gate organic thin film transistor device, in which the threshold voltage of the double-gate organic thin film transistor is modifiable by the double-gate structure, and an output characteristic of an operational unit with this circuit structure can be adjusted to satisfy demand of electronic circuit.

For achieving the above objectives, the present invention provides a double-gate organic thin film transistor device, comprising a substrate, a first gate, a first gate insulating layer, a pair of source and drain, an organic semiconductor active layer, a second gate insulating layer and a second gate. The first gate is formed on the substrate, and the first gate insulating layer is formed on the first gate. The pair of source and drain is formed on the first gate insulating layer. The organic semiconductor active layer is formed on the pair of source and drain, and defining an organic semiconductor channel area therebetween. The second gate insulating layer is formed on the organic semiconductor active layer, and the second gate is formed on the second gate insulating layer. The second gate and first gate share the pair of source and drain as well as the organic semiconductor channel area.

In the double-gate structure formed of the first gate and second gate, a threshold voltage of the double-gate organic thin film transistor is a sum of respective voltages of the first gate and second gate. As such, by adjusting one of the two gate voltages the threshold voltage of another gate can be reduced.

Moreover, the present invention can change the characteristic of the organic thin film transistor to become an enhanced-type transistor or a depletion-type transistor by adjusting the threshold voltage of the second gate.

In one another aspect, the present invention provides a circuit structure with a double-gate organic thin film transistor, comprising a thin film transistor device and a double-gate thin film transistor device. The thin film transistor device has a gate terminal, a first source terminal, a first drain terminal and a first N channel area. The gate terminal is coupled to an input and the first drain terminal is coupled to an output. The double-gate thin film transistor device has a first gate terminal, a second source terminal, a second drain terminal, a second N channel area and a second gate terminal. The first gate terminal and the second gate terminal share the second source terminal, the second drain terminal and the second N channel area. The first gate terminal is coupled to the second drain terminal, the second gate terminal is coupled to a variable bias voltage, and the second source terminal is coupled to the output.

The double-gate thin film transistor device can become a depletion-type N channel transistor by adjusting the bias voltage of the second gate terminal so as to improve the accuracy of signal transmission of the circuit structure. As such, the circuit structure can be designed to become an inverter with an enhanced-type N channel transistor and a depletion-type N channel transistor.

Besides, the present invention provides another kind of inverter, including a thin film transistor having a gate terminal, a first source terminal, a first drain terminal and a first P channel area, in which the gate terminal is coupled to an input terminal and the first source terminal is coupled to an output; and a double-gate thin film transistor having a first gate terminal, a second source terminal, a second drain terminal, a second P channel area and a second gate terminal. The first gate terminal and the second gate terminal share the second source terminal, the second drain terminal and the second P channel area. The first gate terminal is coupled to the second source terminal. The second gate terminal is coupled to a variable bias voltage. The second drain terminal is coupled to the output. By adjusting the bias voltage of the second gate terminal, the double-gate thin film transistor can become a depletion-type P channel transistor. As such, the inverter has an enhanced-type P channel transistor and a depletion-type P channel double gate transistor.

DETAILED DESCRIPTION OF THE PREFERRED EMBODIMENTS

The present invention forms a protection layer on an organic thin film transistor with a bottom gate so as to use the protection layer as another gate insulating layer. And a metal layer is formed on the protection layer to serve as another gate to accomplish a double-gate organic thin film transistor structure. In the double-gate organic thin film transistor structure, the double gates share a pair of source and drain as well as an organic semiconductor channel area. A threshold voltage of the organic thin film transistor is a sum of the threshold voltages of the first gate and second gate. As such, by the double gate structure the threshold voltage of the organic thin film transistor can be adjustably decreased. Moreover, the organic thin film transistor can become a depletion-type transistor or an enhanced-type transistor by controlling the bias voltage of the second gate. The present invention can adopt the above double gate structure in a particular circuit design, and modulating the threshold voltage of the organic thin film transistor with the double gate structure so as to adjust the output characteristic of an operational unit with this kind of particular circuit design, and hence satisfying the demand.

The double-gate organic thin film transistor device and application thereof of the present invention will be described in detail in accordance with following embodiments with reference to accompanying drawings.

Figures 1A, 1B:
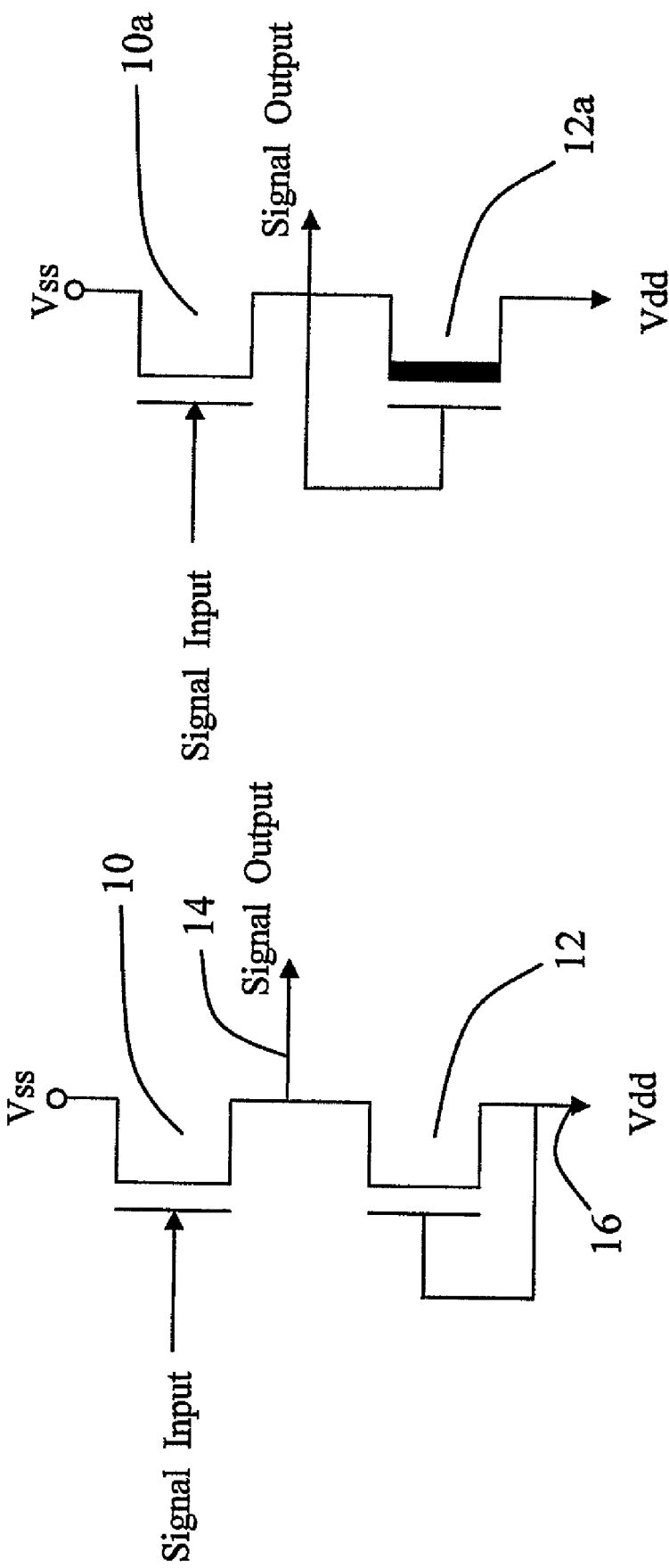
FIG. 1A is a schematic circuit structure of a conventional inverter.
FIG. 1B is a schematic circuit structure of another conventional inverter.
Figure 2A:
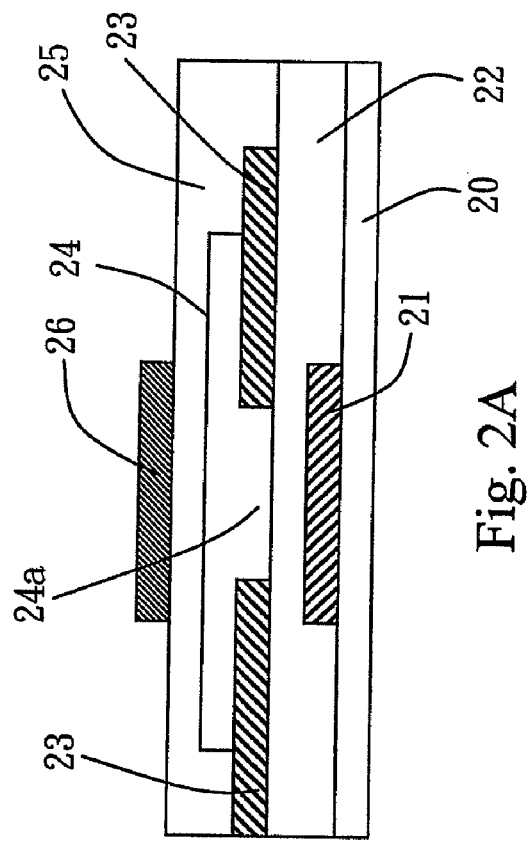
FIG. 2A is a schematic cross-sectional view of a double-gate thin film transistor according to one embodiment of the present invention.

FIG. 2A is a schematic cross-sectional view of the double-gate organic thin film transistor device according to one embodiment of the present invention. The double gate organic thin film transistor device includes a substrate 20, a first gate 21, a first gate insulating layer 22, a pair of source and drain 23, an organic semiconductor active layer 24, a second gate insulating layer 25 and a second gate 26. The first gate 21 is a first metal gate formed on the substrate 20 and the first gate insulating layer 22 can be a silicon nitride ($SiN_x$) layer or any insulating layer such as silicon dioxide, $Ta_2O_5$, Polyimide and PVA, etc. formed on the first gate 21. The first gate 21 also can be formed of any conducting material, such as ITO, IZO and PEDOT, etc. The pair of source and drain 23 includes a second metal formed on the first gate insulating layer 22. The pair of source and drain 23 also can be formed of any conducting material, such as ITO, IZO and PEDOT, etc. The organic semiconductor active layer 24 is formed on the pair of source and drain 23, and defining an organic semiconductor channel area 24a therebetween. The second gate insulating layer 25 can be a silicon nitride layer or any insulating layer, such as silicon dioxide, $Ta_2O_5$, Polyimide and PVA, etc., which is formed on the organic semiconductor active layer 24, and the second gate insulating layer 25 also can be used as a protection layer to protect the first gate 21, the pair of source and drain 23 as well as the organic semiconductor active layer 24 underlying the second gate insulating layer 25. The second gate 26 is a third metal layer or any conducting layer, such as ITO, IZO and PEDOT, etc. formed on the second gate insulating layer 25. The second gate 26 and first gate 21 share the pair of source and drain 23 as well as the organic semiconductor channel area 24a.

In this embodiment, the characteristic of the double-gate organic thin film transistor can be changed to become a depletion-type or enhanced-type N channel transistor by controlling the bias voltage $V_g$ of the second gate 26. Moreover, the threshold voltage of the double-gate organic thin film transistor is a sum of the respective threshold voltages of the first gate 21 and second gate 26. By the double gate structure, the threshold voltage of the double-gate organic thin film transistor can be reduced.

Figure 2B:
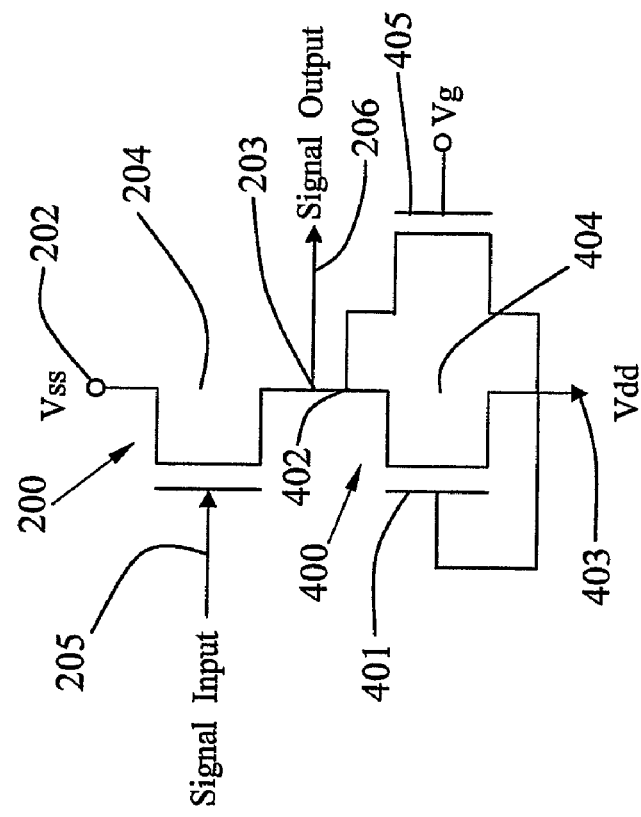
FIG. 2B is a schematic circuit structure of an inverter with the double-gate thin film transistor of FIG. 2A.
Figure 2D:
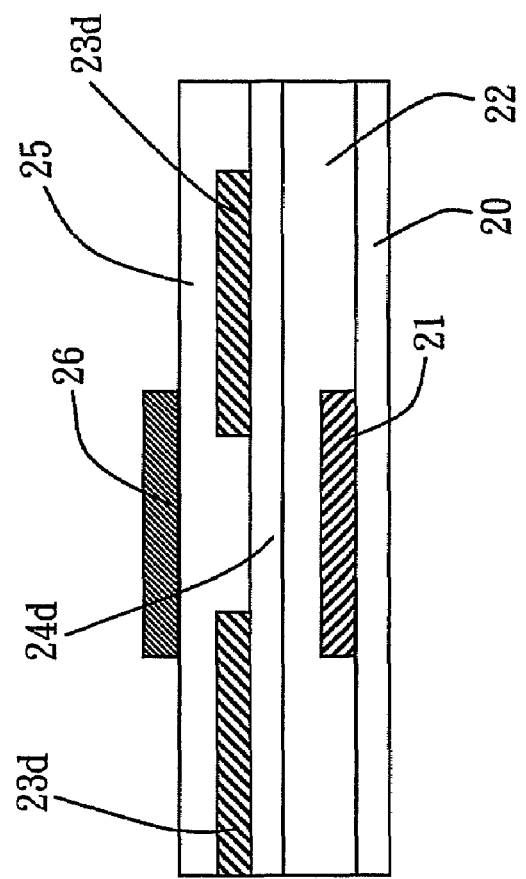
FIG. 2D is a schematic cross-sectional view of a variance of FIG. 2A.

FIG. 2D is a schematic cross-sectional view of a variance of FIG. 2A, in which the double gate organic thin film transistor device includes a substrate 20, a first gate 21, a first gate insulating layer 22, an organic semiconductor active layer 24d, a pair of source and drain 23d, a second gate insulating layer 25 and a second gate 26. The first gate 21 is a first metal gate formed on the substrate 20 and the first gate insulating layer 22 can be a silicon nitride ($SiN_x$) layer or any insulating layer such as silicon dioxide, $Ta_2O_5$, Polyimide and PVA, etc. formed on the first gate 21. The first gate 21 also can be formed of any conducting material, such as ITO, IZO and PEDOT, etc. The organic semiconductor active layer 24d is formed on the first gate insulating layer 22. The pair of source and drain 23d includes a second metal formed on the organic semiconductor active layer 24d. The pair of source and drain 23d also can be formed of any conducting material, such as ITO, IZO and PEDOT, etc. A portion of the organic semiconductor active layer 24d between the pair of source and drain 23d is defined as a channel area. The second gate insulating layer 25 can be a silicon nitride layer or any insulating layer, such as silicon dioxide, $Ta_2O_5$, Polyimide and PVA, etc., which is formed on the pair of source and drain 23d and the organic semiconductor active layer 24d, and the second gate insulating layer 25 also can be used as a protection layer to protect the first gate 21, the pair of source and drain 23d as well as the organic semiconductor active layer 24d underlying the second gate insulating layer 25. The second gate 26 is a third metal layer or any conducting layer, such as ITO, IZO and PEDOT, etc. formed on the second gate insulating layer 25. The second gate 26 and first gate 21 share the pair of source and drain 23d as well as the organic semiconductor channel area 24d.

FIG. 2B is a schematic circuit structure of an inverter with the double-gate organic thin film transistor of FIG. 2A. The circuit of the inverter includes an enhanced-type N channel thin film transistor device 200 and a depletion-type N channel double-gate thin film transistor device 400. The enhanced-type N channel thin film transistor device 200 includes a gate terminal 201, a first source terminal ($V_{ss}$) 202, a first drain terminal 203 and a first N channel area 204. The gate terminal 201 is coupled to an input 205 and the first drain terminal 203 is coupled to an output 206. The double-gate thin film transistor device 400 is a double-gate organic thin film transistor, which includes a first gate terminal 401, a second source 402, a second drain ($V_{dd}$) 403, a second N channel area 404 and a second gate terminal 405. The first gate terminal 401 and second gate terminal 405 share the second source 402, the second drain 403 and the second N channel area 404. The first gate terminal 401 is coupled to the second drain 403, the second gate terminal 405 is coupled to a variable bias voltage $V_g$, and the second source 402 is coupled to the output 206.

In the circuit of the inverter, the second gate terminal 405 is coupled to a variable bias voltage $V_g$. As such, the double-gate organic thin film transistor device 400 can be modified to become a depletion-type N channel transistor by adjusting the bias voltage $V_g$. When the double-gate organic thin film transistor device 400 is a depletion-type N channel double gate transistor, the inverter shown in FIG. 2B includes an enhanced-type N channel transistor and a depletion-type N channel double gate transistor. In the circuit of the inverter, there is no voltage difference $V_{th}$ between the second drain terminal ($V_{dd}$) 403 and the output 206, the output signal of the output 206 is more close to a real signal, and thus the signal distortion can be resolved. Furthermore, the double-gate organic thin film transistor device 400 also has a lower threshold voltage.

Figure 2C:
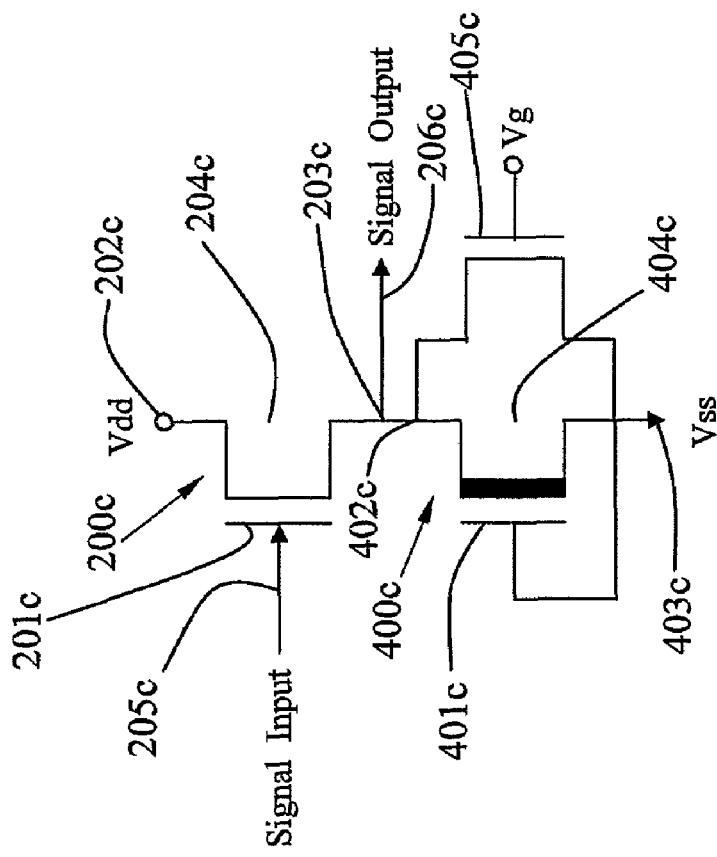
FIG. 2C is a schematic circuit structure of another inverter with the double-gate thin film transistor of FIG. 2A.

FIG. 2C is a schematic circuit structure of another inverter with the double-gate organic thin film transistor of FIG. 2A. This inverter includes an enhanced-type P channel thin film transistor 200c and a depletion-type P channel double-gate thin film transistor 400c. The enhanced-type P channel thin film transistor 200c includes a gate terminal 201c, a first drain terminal ($V_{dd}$) 202c, a first source terminal 203c and a first P channel area 204c. The gate terminal 201c is coupled to an input 205c, and the first source terminal 203c is coupled to an output 206c. The double-gate thin film transistor 400c is a double-gate organic thin film transistor, which has a first gate terminal 401c, a second drain terminal 402c, a second drain terminal ($V_{ss}$) 403c, a second P channel area 404c and a second gate terminal 405c. The first gate terminal 401c and the second gate terminal 405c share the second drain terminal 402c, the second source terminal 403c and the second P channel area 404c. The first gate terminal 401c is coupled to the second source terminal 403c. The second gate terminal 405c is coupled to a variable bias voltage $V_g$. The second drain terminal 402c is coupled to the output 206c.

In this inverter circuit structure, the second gate terminal 405c is coupled to a variable bias voltage $V_g$. As such, by adjusting the bias voltage $V_g$, the double-gate organic thin film transistor 400c can become a depletion-type P channel transistor. When the double-gate organic thin-film transistor 400c becomes a depletion-type P channel double-gate transistor, the inverter of FIG. 2C would include an enhanced-type P channel transistor and a depletion-type P channel double gate transistor. In this inverter circuit structure, there is no voltage difference $V_{th}$ between the second source terminal ($V_{ss}$) 403c and the output 206c, the output signal of the output 206c is more close to a real signal, and thus the signal distortion can be resolved. Furthermore, the double-gate organic thin film transistor device 400c also has a lower threshold voltage.

Figure 3:
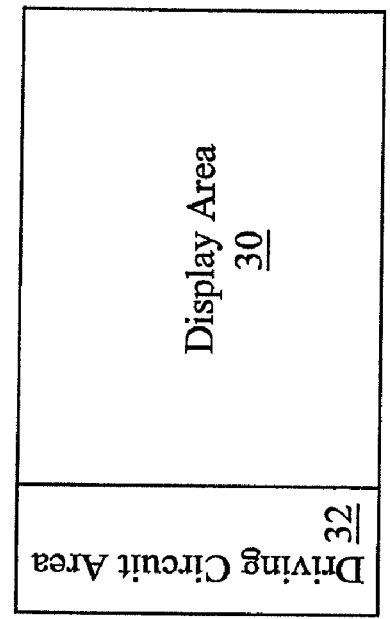
FIG. 3 is a schematic circuit block diagram of a display panel of the present invention.

FIG. 3 is an application of the inverter circuit of FIG. 2B. FIG. 3 is a schematic circuit block diagram of the display panel, which includes a display area 30 and a driving circuit area 32. The display area 30 includes a plurality of columns of single gate transistors (not shown). Each column of the single gate transistors has a plurality of single gate transistors serving as switch elements of respective pixels. The driving circuit area 32 has a plurality of inverters as shown in FIG. 2B. An output of each of the inverters is coupled to one column of the single gate transistors to drive the transistor switch elements of the single gate transistor column. Because the driving circuit of the display panel of FIG. 3 adopts the inverter circuit of FIG. 2B, the driving signal sent out from the driving circuit is not easily distorted, and the respective pixels can be driven smoothly. Moreover, the double-gate thin film transistor 400 of the inverter can become a depletion-type N channel transistor by controlling the bias voltage $V_g$ of the second gate 405. From the perspective of manufacturing process, the manufacturing process of the thin film transistor of the driving circuit would not affect the manufacturing process of the single gate thin film transistor of the pixel area, and furthermore affecting the characteristic of the single gate thin film transistors. The manufacturing yield of the display panel thus can be improved.

The double-gate organic thin film transistor of the present invention has a simple structure and modifiable characteristics, whose manufacturing process is simple and easily accomplished. Thus, the present invention has commercial potential.

While the invention has been described by way of examples and in terms of preferred embodiments, it is to be understood that those who are familiar with the subject art can carry out various modifications and similar arrangements and procedures described in the present invention and also achieve the effectiveness of the present invention. Hence, it is to be understood that the description of the present invention should be accorded with the broadest interpretation to those who are familiar with the subject art, and the invention is not limited thereto.

What is claimed is:

1. An inverter circuit structure with a double-gate organic thin film transistor device, comprising:
   an enhanced-type thin film transistor device having a gate terminal, a first source terminal, a first drain terminal and a first N channel area, said gate terminal coupled to an input and said first drain terminal coupled to an output; and
   a depletion-type double-gate thin film transistor device having a first gate terminal, a second source terminal, a second drain terminal, a second N channel area and a second gate terminal, wherein said first gate terminal and said second gate terminal share said second source terminal, said second drain terminal and said second N channel area, said first gate terminal is coupled to said second drain terminal, said second gate terminal is coupled to a variable bias voltage by which a voltage applied to said second gate terminal is adjustable so that said doube-gate thin film transistor device becomes depletion-type, and said second source terminal is coupled to said output.

2. The inverter circuit structure with a double-gate organic thin film transistor device as claimed in claim 1, wherein said double-gate thin film transistor is a double-gate organic thin film transistor.

* * * * *